(12) United States Patent
Tao et al.

(10) Patent No.: US 9,749,166 B2
(45) Date of Patent: Aug. 29, 2017

(54) ESTIMATION APPARATUS AND COMPENSATION APPARATUS FOR CLIPPING DISTORTION OF MULTICARRIER SIGNALS AND RECEIVER

(71) Applicant: FUJITSU LIMITED, Kawasaki (JP)

(72) Inventors: Zhenning Tao, Beijing (CN); Hao Chen, Beijing (CN)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 15/062,552

(22) Filed: Mar. 7, 2016

(65) Prior Publication Data
US 2016/0269211 A1 Sep. 15, 2016

(30) Foreign Application Priority Data
Mar. 12, 2015 (CN) .......................... 2015 1 0107985

(51) Int. Cl.
*H04L 27/26* (2006.01)
*H04L 27/36* (2006.01)
*H04L 1/00* (2006.01)
*H03F 1/32* (2006.01)

(52) U.S. Cl.
CPC ........ *H04L 27/2623* (2013.01); *H04L 27/368* (2013.01); *H03F 1/3247* (2013.01); *H03F 2201/3227* (2013.01); *H04B 2201/70706* (2013.01); *H04L 1/0026* (2013.01); *H04L 27/2624* (2013.01)

(58) Field of Classification Search
CPC .............. H04L 27/2623; H04L 27/368; H04L 27/2624; H04L 1/0026; H04B 2201/70706; H03F 1/3247; H03F 2201/3227
See application file for complete search history.

(56) References Cited

U.S. PATENT DOCUMENTS 7,944,991 B2 * 5/2011 Zhao ................... H04L 27/2623
375/260
2005/0078742 A1 * 4/2005 Cairns ..................... H04B 1/712
375/148

* cited by examiner

*Primary Examiner* — Janice Tieu
(74) *Attorney, Agent, or Firm* — Staas & Halsey LLP

(57) ABSTRACT

Embodiments of the present disclosure provide an estimation apparatus and compensation apparatus for clipping distortion of multicarrier signals and a receiver. The estimation apparatus includes: a first calculating unit configured to multiply an error signal of each subcarrier in all or part of subcarriers in received multicarrier signals by a conjugation of an error signal of a subcarrier neighboring or spaced apart from each subcarrier; a second calculating unit configured to calculate an average value of all results of multiplication; a third calculating unit configured to calculate parameters of the clipping distortion of the multicarrier signals according to the average value; and an estimating unit configured to estimate the clipping distortion of the multicarrier signals according to the calculated parameters of the clipping distortion. By calculating the parameters of the clipping distortion of the multicarrier signals according to the error signals of the subcarriers, the clipping distortion of the multicarrier signals may be accurately estimated and compensated, with the method of calculation being simple and the bit error rate being low.

9 Claims, 6 Drawing Sheets

ESTIMATION APPARATUS AND COMPENSATION APPARATUS FOR CLIPPING DISTORTION OF MULTICARRIER SIGNALS AND RECEIVER

TECHNICAL FIELD

The present disclosure relates to the field of communications, and in particular to an estimation apparatus and compensation apparatus for clipping distortion of multicarrier signals and a receiver.

BACKGROUND

Multiple subcarrier signals are adopted in the multicarrier modulation technique, in which data streams are divided into several sub-data streams, so that the sub-data streams have much lower transmission bit rates, and these data are used to modulate several subcarriers, respectively. Multicarrier modulation signals are characterized in having relatively low transmission rates of subcarrier data and relatively long periods of code elements. Multicarrier modulation may be realized in multiple technical ways, such as discrete multitone (DMT), and orthogonal frequency division multiplexing (OFDM), etc.

A problem existed in the multicarrier modulation signals is that their peak to average power ratios (PAPRs) are relatively high. In practical applications, a peak value of an output signal of a transmitter is often limited, hence, in order to increase average power of the signals, the PAPRs of the signals need to be lowered. One of the most often used methods is to perform clipping directly on the multicarrier modulation signals. The multicarrier modulation signals are formed by superimposing multiple subcarrier signals, hence, in some special bitmaps, extremely high PAPRs will occur. Clipping operations on these symbols of extremely high PAPRs will produce very large clipping distortion, thereby resulting in burst errors in these symbols. Although a probability of occurrence of such burst errors is not high and its effect on an average bit error rate is relatively few, the burst errors will result in a failure of forward error correction (FEC) decoding, thereby causing a communication failure. Therefore, the clipping distortion needs to be estimated and the multicarrier signals need to be compensated according to a result of estimation.

Currently, an existing method is to reestablish time-domain signals and repeat processes of clipping at a receiving end after judging received multicarrier frequency-domain signals, and compensate for the clipping distortion, so as to eliminate the effect of the clipping distortion on the communication system. FIG. 1 is a flowchart of an existing method for compensating clipping distorting of multicarrier signals. As shown in FIG. 1, at a transmitting end, coding, interpolation and mapping, inverse fast Fourier transform (IFFT), clipping, fast Fourier transform (FFT), out-of-band removal and inverse fast Fourier transform (IFFT) are performed on signal data, which are transmitted by a transmission antenna; where, the inverse fast Fourier transform, clipping, fast Fourier transform and out-of-band removal constitute clipping and filtering processing; and at a receiving end, de-mapping and sorting, decoding, interpolation and mapping are performed on received signals after fast Fourier transform is performed on them, and the clipping and filtering processing performed at the transmitting end, i.e. the inverse fast Fourier transform, clipping, fast Fourier transform and out-of-band removal, are repeated on the signals after being performed interpolation and mapping, then a clipping noise component $\hat{D}$ of each subcarrier is estimated according to the signals after being performed the interpolation, mapping and attenuation, a channel gain H of each subcarrier is estimated according to the clipping noise component, and the received signals are compensated according to the channel gain H.

It should be noted that the above description of the background art is merely provided for clear and complete explanation of the present disclosure and for easy understanding by those skilled in the art. And it should not be understood that the above technical solution is known to those skilled in the art as it is described in the background of the present disclosure.

SUMMARY

When the above method is used to compensate for the clipping distortion of the multicarrier signals, an iterative calculation process is often needed, which results in high complexity of the calculation process and a high bit error rate.

Embodiments of the present disclosure provide an estimation apparatus and compensation apparatus for clipping distortion of multicarrier signals and a receiver. By calculating the parameters of the clipping distortion of the multicarrier signals according to the error signals of the subcarriers, the clipping distortion of the multicarrier signals may be accurately estimated and compensated, with the method of calculation being simple and the bit error rate being low.

According to a first aspect of embodiments of the present disclosure, there is provided an estimation apparatus for clipping distortion of multicarrier signals, including: a first calculating unit configured to multiply an error signal of each subcarrier in all or part of subcarriers in received multicarrier signals by a conjugation of an error signal of a subcarrier neighboring or spaced apart from the subcarrier; a second calculating unit configured to calculate an average value of all results of multiplication; a third calculating unit configured to calculate parameters of the clipping distortion of the multicarrier signals according to the average value; and an estimating unit configured to estimate the clipping distortion of the multicarrier signals according to the calculated parameters of the clipping distortion.

According to a second aspect of embodiments of the present disclosure, there is provided a compensation apparatus for clipping distortion of multicarrier signals, including: a first calculating unit configured to multiply an error signal of each subcarrier in all or part of subcarriers in received multicarrier signals by a conjugation of an error signal of a subcarrier neighboring or spaced apart from the subcarrier; a second calculating unit configured to calculate an average value of all results of multiplication; a third calculating unit configured to calculate parameters of the clipping distortion of the multicarrier signals according to the average value; an estimating unit configured to estimate the clipping distortion of the multicarrier signals according to the calculated parameters of the clipping distortion; and a compensating unit configured to compensate for all or part of subcarrier signals in the multicarrier signals according to the estimated clipping distortion.

According to a third aspect of embodiments of the present disclosure, there is provided a receiver, including the estimation apparatus for clipping distortion of multicarrier signals described in the first aspect of the embodiment of the present disclosure or the compensation apparatus for clipping distortion of multicarrier signals described in the second aspect of the embodiment of the present disclosure.

Advantages of the embodiments of the present disclosure exist in that by calculating the parameters of the clipping distortion of the multicarrier signals according to the error signals of the subcarriers, the clipping distortion of the multicarrier signals may be accurately estimated and compensated, with the method of calculation being simple and the bit error rate being low.

With reference to the following description and drawings, the particular embodiments of the present disclosure are disclosed in detail, and the principle of the present disclosure and the manners of use are indicated. It should be understood that the scope of embodiments of the present disclosure is not limited thereto. Embodiments of the present disclosure contain many alternations, modifications and equivalents within the scope of the terms of the appended claims.

Features that are described and/or illustrated with respect to one embodiment may be used in the same way or in a similar way in one or more other embodiments and/or in combination with or instead of the features of the other embodiments.

It should be emphasized that the term "comprises/includes" when used in this specification is taken to specify the presence of stated features, integers, steps or components but does not preclude the presence or addition of one or more other features, integers, steps, components or groups thereof.

BRIEF DESCRIPTION OF THE DRAWINGS

The drawings are included to provide further understanding of the present disclosure, which constitute part of the specification and illustrate the preferred embodiments of the present disclosure, and are used for setting forth the principles of the present disclosure together with the description. It is obvious that the accompanying drawings in the following description are some embodiments of the present disclosure only, and a person of ordinary skill in the art may obtain other accompanying drawings according to these accompanying drawings without making an inventive effort. In the drawings.

DETAILED DESCRIPTION

These and further aspects and features of the present disclosure will be apparent with reference to the following description and attached drawings. In the description and drawings, particular embodiments of the disclosure have been disclosed in detail as being indicative of some of the ways in which the principles of the disclosure may be employed, but it is understood that the disclosure is not limited to the described embodiments. Rather, the disclosure includes all changes, modifications and equivalents falling within the scope of the appended claims.

Embodiment 1

Figure 1:
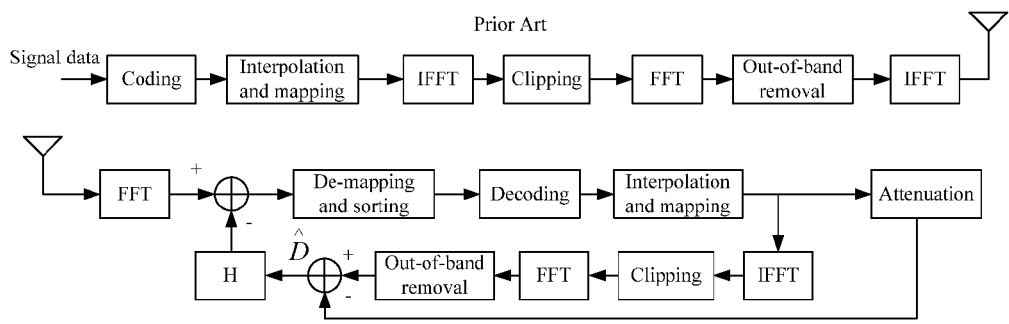
FIG. 1 is a flowchart of an existing method for compensating clipping distorting of multicarrier signals.
Figure 2:
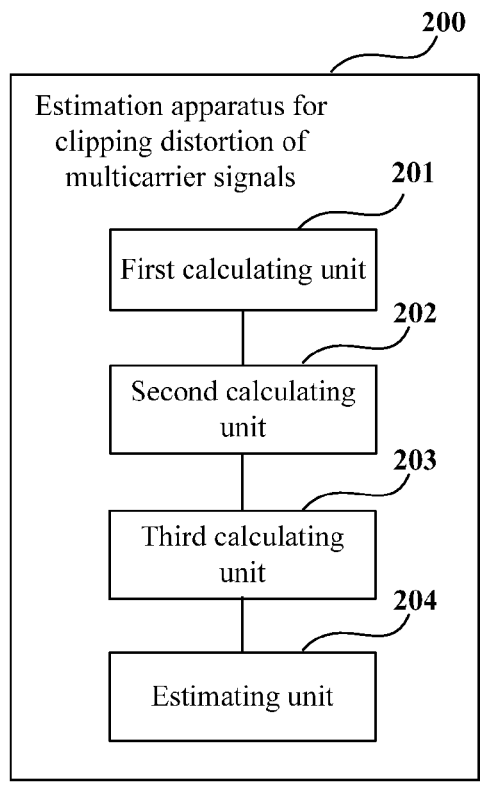
FIG. 2 is a schematic diagram of a structure of the estimation apparatus for clipping distortion of multicarrier signals of Embodiment 1 of the present disclosure.

FIG. 2 is a schematic diagram of a structure of the estimation apparatus for clipping distortion of multicarrier signals of Embodiment 1 of the present disclosure. As shown in FIG. 2, the apparatus 200 includes a first calculating unit 201, a second calculating unit 202, a third calculating unit 203 and an estimating unit 201.

The first calculating unit 201 is configured to multiply an error signal of each subcarrier in all or part of subcarriers in received multicarrier signals by a conjugation of an error signal of a subcarrier neighboring or spaced apart from each subcarrier;

the second calculating unit 202 is configured to calculate an average value of all results of multiplication;

the third calculating unit 203 is configured to calculate parameters of the clipping distortion of the multicarrier signals according to the average value;

and the estimating unit 204 is configured to estimate the clipping distortion of the multicarrier signals according to the calculated parameters of the clipping distortion.

It can be seen from the above embodiment that by calculating the parameters of the clipping distortion of the multicarrier signals according to the error signals of the subcarriers, the clipping distortion of the multicarrier signals may be accurately estimated, with the method of calculation being simple and the bit error rate being low.

In this embodiment, as the clipping distortion is represented as a pulse in a time domain, additive interference of the same amplitude is generated in each subcarrier, and a location of the clipping distortion in a time-domain symbol decides a phase of the clipping distortion in each subcarrier, hence, an error signal of each subcarrier in all or part of subcarriers in received multicarrier signals caused jointly by the clipping distortion and a white noise may be expressed by Formula (1) below:

$$\text{Err}_k = be^{j\phi_k} + n_k \qquad (1);$$

where, $\text{Err}_k$ denotes an error signal of a k-th subcarrier, $be^{j\phi_k}$ denotes a clipping distortion of the k-th subcarrier, b denotes an amplitude of the clipping distortion, $\phi_k$ denotes a phase of the clipping distortion at the k-th subcarrier, $$\phi_k = -2\pi \times \frac{k-1}{2N} \times a,$$

N denotes the number of subcarriers, N being a positive integer, k being a positive integer less than or equal to N, a denotes a location of a pulse of the clipping distorting in a time-domain waveform, a=[0, 1, 2, . . . 2N−1], and $n_k$ denotes an additive Gaussian white noise of the k-th subcarrier.

In this embodiment, the error signal may be obtained by using an existing method. For example, it may be obtained by judging the received signals and subtracting the received signals by the judged signals.

In this embodiment, the first calculating unit 201 multiplies the error signal of each subcarrier in all or part of subcarriers in the received multicarrier signals by the conjugation of the error signal of the subcarrier neighboring or spaced apart from the subcarrier, and the second calculating unit 202 calculates the average value of all results of multiplication.

In this embodiment, in performing the multiplication operation, the first calculating unit 201 may use error signals of all subcarriers in the received multicarrier signals for the operation, and may also select error signals of part of the subcarriers for the operation. For example, subcarriers of a noise less than a predefined first threshold value or a signal to noise ratio greater than a predefined second threshold value may be selected for the operation. For example, the predefined first threshold and the predefined second threshold value may be defined according to an actual situation.

By selecting error signals of the subcarriers of a noise less than a predefined first threshold value or a signal to noise ratio greater than a predefined second threshold value for the operation, accuracy of the estimation of the clipping distortion may further be improved.

In this embodiment, the first calculating unit 201 may multiply the error signal of each subcarrier in all or part of subcarriers by the conjugation of the error signal of the subcarrier neighboring the subcarrier, and may also multiply the error signal of each subcarrier in all or part of subcarriers by the conjugation of the error signal of the subcarrier spaced apart from the subcarrier. For example, they may be space apart each other by one or more subcarriers. And the number of spaced subcarriers is not limited in embodiments of the present disclosure.

Following description is given taking the multiplication of the error signal of each subcarrier in all of subcarriers in the received multicarrier signals by the conjugation of the error signal of the subcarrier neighboring the subcarrier as an example.

For example, the first calculating unit 201 may use following Formula (2) to calculate a product of the error signal of each subcarrier and the conjugation of the error signal of the subcarrier neighboring the subcarrier:

$$S_2 = Err_2 \times Err_1^*$$
$$\ldots$$
$$S_k = Err_k \times Err_{k-1}^*$$
$$\ldots$$
$$S_N = Err_N \times Err_{N-1}^*; \quad (2)$$

where, $Err_k$ denotes an error signal of a k-th subcarrier, N denotes the number of subcarriers, N being a positive integer, k being a positive integer less than or equal to N.

After obtaining a calculation result of the first calculating unit 201, the second calculating unit 202 may calculate an average value of all products calculated by the first calculating unit 201 according to following Formula (3):

$$Mon = \text{mean}(S_k) = b^2 e^{j\Delta\varphi} \quad (3);$$

where, Mon denotes a result of calculation of the second calculating unit 202, $Err_k$ denotes an error signal of a k-th subcarrier, $Err^*_{k-1}$ denotes a conjugation of an error signal of a (k−1)-th subcarrier, b denotes an amplitude of the clipping distortion, $$\Delta\varphi = -2\pi \frac{a}{2N},$$

N denotes the number of subcarriers, N being a positive integer, k is a positive integer from 2 to N, and a denotes a location of a pulse of the clipping distorting in a time-domain waveform.

In this embodiment, after the second calculating unit 202 calculates the average value, the third calculating unit 203 calculates the parameters of the clipping distortion of the multicarrier signals according to the average value. The parameters of the clipping distortion include, for example, the amplitude of the clipping distortion b and the location a of a pulse of the clipping distorting in a time-domain waveform. For example, a is slope of a phase $\phi_k$ of the clipping distortion varying according to serial numbers k of the subcarriers.

A structure of the third calculating unit 203 and a method of calculating parameters of the clipping distortion shall be illustrated below.

Figure 3:
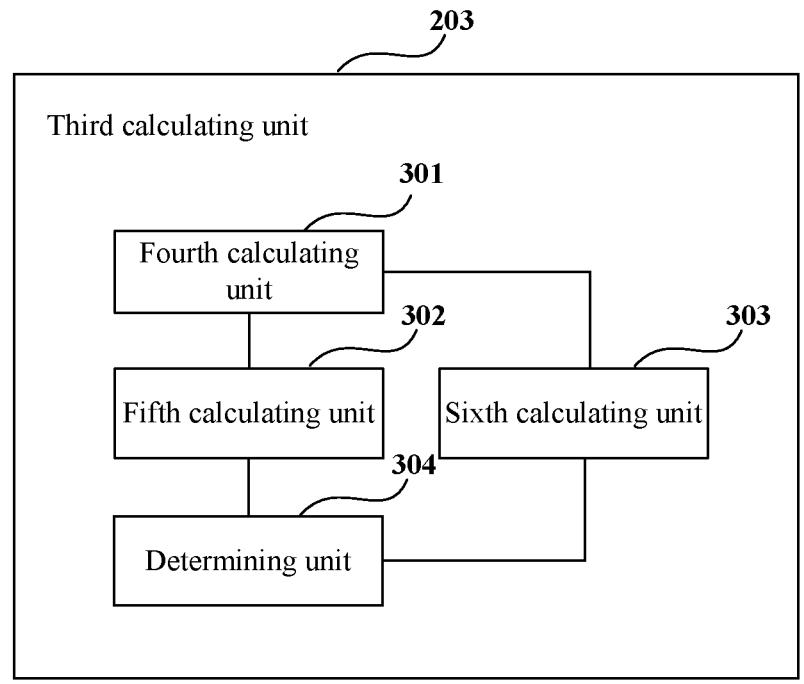
FIG. 3 is a schematic diagram of a structure of the third calculating unit 203 of Embodiment 1 of the present disclosure.

FIG. 3 is a schematic diagram of a structure of the third calculating unit 203 of this embodiment. As shown in FIG. 3, the third calculating unit 203 includes:

a fourth calculating unit 301 configured to calculate the location a of the pulse of the clipping distortion in the time-domain waveform by taking an angle of the average value of all results of multiplication; and a fifth calculating unit 302 configured to calculate the amplitude b of the clipping distortion by finding a square root of an absolute value of the average value of all results of multiplication.

For example, by deriving formulae (2) and (3), the fourth calculating unit 301 and the fifth calculating unit 302 may calculate the location a of the pulse of the clipping distortion in the time-domain waveform and the amplitude b of the clipping distortion according respectively to following formulae (4) and (5):

$$a = -\arg(Mon) \times N/\pi \quad (4);$$

$$b = \pm\sqrt{\text{abs}(Mon)} \quad (5);$$

where, a denotes the location of a pulse of the clipping distorting in a time-domain waveform, b denotes the amplitude of the clipping distortion, Mon denotes a result of calculation of above Formula (3), and N denotes the number of subcarriers, N being a positive integer.

In this embodiment, the third calculating unit 203 may further include:

a sixth calculating unit 303 configured to calculate a phase of each subcarrier of the clipping distortion in all or part of subcarriers in multiple carriers according to the location a of the pulse of the clipping distortion in the time-domain waveform, and calculate the amplitude b of the clipping distortion according to the phase and the error signal of each subcarrier in all or part of the subcarriers in the multiple carriers; and a determining unit 304 configured to compare the amplitude b of the clipping distortion calculated by the sixth calculating unit 303 and the amplitude b of the clipping distortion calculated by the fifth calculating unit 302, and determine a symbol of the amplitude b of the clipping distortion calculated by the fifth calculating unit 302.

For example, the sixth calculating unit 303 may calculate the amplitude b of the clipping distortion according to Formula (6) below:

$$b = \text{mean}(\text{Err}_k \times e^{-j\phi_k}) = \text{mean}(b + n_k e^{-j\phi_k}) \quad (6);$$

where, b denotes the amplitude of the clipping distortion, $\phi_k$ denotes a phase of the clipping distortion at the k-th subcarrier, $$\phi_k = -2\pi \times \frac{k-1}{2N} \times a,$$

N denotes the number of subcarriers, N being a positive integer, k being a positive integer from 2 to N, a denotes a location of a pulse of the clipping distorting in a time-domain waveform, and $n_k$ denotes an additive Gaussian white noise of the k-th subcarrier.

And the determining unit 304 may determine whether a symbol of the amplitude b of the clipping distortion is positive or negative according to the amplitude b of the clipping distortion calculated by the sixth calculating unit 303 according to above Formula (6), hence, determine a positive or negative sign of the b calculated by the fifth calculating unit 302 according to above Formula (5), and take the b with the positive or negative sign being determined as the amplitude of the clipping distortion.

Figure 4:
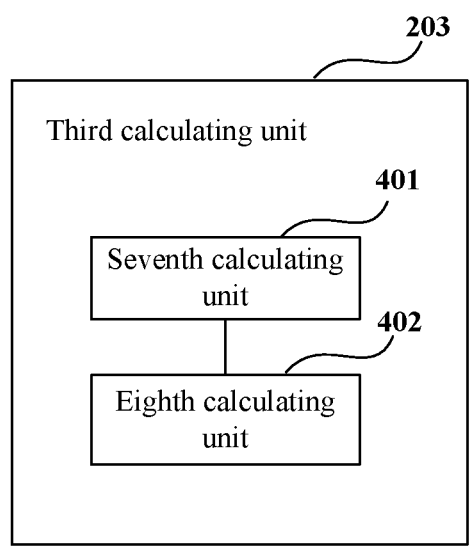
FIG. 4 is another schematic diagram of a structure of the third calculating unit 203 of Embodiment 1 of the present disclosure.

FIG. 4 is another schematic diagram of a structure of the third calculating unit 203 of this embodiment. As shown in FIG. 4, the third calculating unit 203 includes:

a seventh calculating unit 401 configured to take an angle of the average value of all results of multiplication, and calculate the location a of the pulse of the clipping distortion in the time-domain waveform; and an eighth calculating unit 402 configured to calculate a phase of each subcarrier of the clipping distortion in all or part of the subcarriers in the multiple carriers according to the location a of the pulse of the clipping distortion in the time-domain waveform, and calculate the amplitude b of the clipping distortion according to the phase and the error signal of each subcarrier in all or part of the subcarriers in the multiple carriers.

In this embodiment, a method for calculating the location a of the pulse of the clipping distortion in the time-domain waveform by the seventh calculating unit 401 is identical to that of the fourth calculating unit 301, a method for calculating the amplitude b of the clipping distortion by the eighth calculating unit 402 is identical to that of the sixth calculating unit 303, which shall not be described herein any further.

In this embodiment, after the third calculating unit 203 calculates the parameters of the clipping distortion, the estimating unit 204 estimates the clipping distortion of the multicarrier signals according to the calculated parameters of the clipping distortion.

For example, after the third calculating unit 203 calculates the location a of the pulse of the clipping distortion in the time-domain waveform and the amplitude b of the clipping distortion, the clipping distortion of the multicarrier signals may be calculated according to Formula (7) below:

$$D_k = b \times e^{j\phi_k} \quad (7);$$

where, $D_k$ denotes the clipping distortion of the k-th subcarrier, b denotes the amplitude of clipping distortion, $\phi_k$ denotes a phase of the clipping distortion at the k-th subcarrier, $$\phi_k = -2\pi \times \frac{k-1}{2N} \times a,$$

N denotes the number of subcarriers, N being a positive integer, k being a positive integer from 2 to N, and a denotes a location of a pulse of the clipping distorting in a time-domain waveform.

It can be seen from the above embodiment that by calculating the parameters of the clipping distortion of the multicarrier signals according to the error signals of the subcarriers, the clipping distortion of the multicarrier signals may be accurately estimated, with the method of calculation being simple and the bit error rate being low.

Embodiment 2

Figure 5:
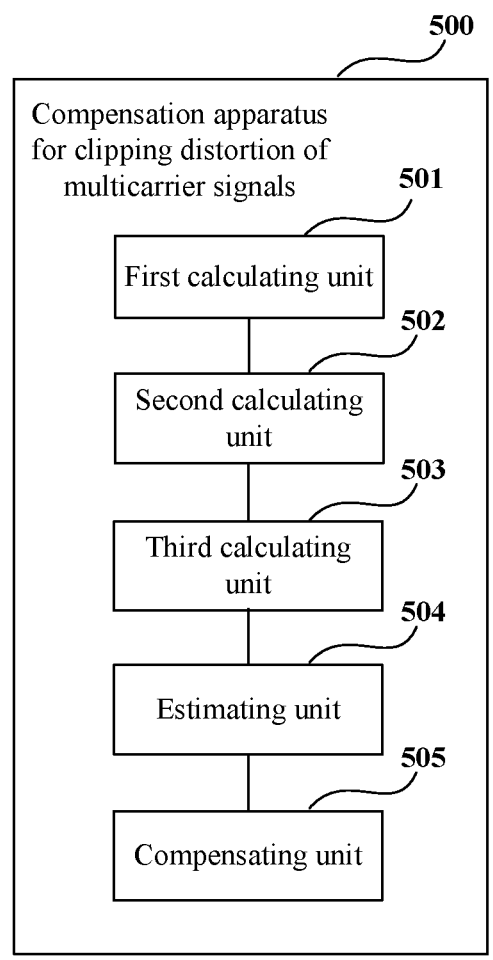
FIG. 5 is a schematic diagram of a structure of the compensation apparatus for clipping distortion of multicarrier signals of Embodiment 2 of the present disclosure.

FIG. 5 is a schematic diagram of a structure of the compensation apparatus for clipping distortion of multicarrier signals of Embodiment 2 of the present disclosure. As shown in FIG. 5, the apparatus 500 includes: a first calculating unit 501, a second calculating unit 502, a third calculating unit 503, an estimating unit 504 and a compensating unit 505.

The first calculating unit 501 is configured to multiply an error signal of each subcarrier in all or part of subcarriers in received multicarrier signals by a conjugation of an error signal of a subcarrier neighboring or spaced apart from the subcarrier;

the second calculating unit 502 is configured to calculate an average value of all results of multiplication;

the third calculating unit 503 is configured to calculate parameters of the clipping distortion of the multicarrier signals according to the average value;

the estimating unit 504 is configured to estimate the clipping distortion of the multicarrier signals according to the calculated parameters of the clipping distortion;

and the compensating unit 505 is configured to compensate for all or part of subcarrier signals in the multicarrier signals according to the estimated clipping distortion.

It can be seen from the above embodiment that by calculating the parameters of the clipping distortion of the multicarrier signals according to the error signals of the subcarriers, the clipping distortion of the multicarrier signals may be accurately estimated and compensated, with the method of calculation being simple and the bit error rate being low.

In this embodiment, structures and functions of the first calculating unit 501, the second calculating unit 502, the third calculating unit 503 and the estimating unit 504 are identical to those of the first calculating unit 201, the second calculating unit 202, the third calculating unit 203 and the estimating unit 204 in Embodiment 1, which shall not be described herein any further.

In this embodiment, the compensating unit 505 may compensate for all of subcarrier signals in the multicarrier signals according to the estimated clipping distortion, and may also compensate for part of subcarrier signals in the multicarrier signals according to the estimated clipping distortion. For example, the compensating unit 505 may compensate for subcarrier signals of a modulation constellation greater than a predefined threshold value in the multicarrier signals according to the estimated clipping distortion, thereby further improving accuracy of the compensation of the clipping distortion, and further lowering the bit error rate. For example, the predefined threshold value may be defined according to an actual situation.

It can be seen from the above embodiment that by calculating the parameters of the clipping distortion of the multicarrier signals according to the error signals of the subcarriers, the clipping distortion of the multicarrier signals may be accurately estimated and compensated, with the method of calculation being simple and the bit error rate being low.

Embodiment 3

Figure 6:
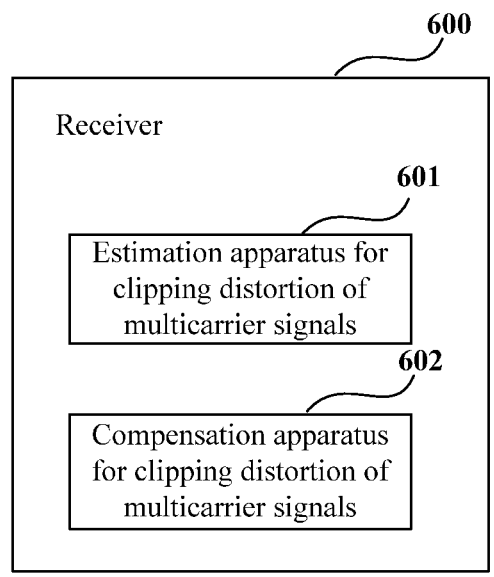
FIG. 6 is a schematic diagram of a structure of the receiver of Embodiment 3 of the present disclosure.

FIG. 6 is a schematic diagram of a structure of the receiver of Embodiment 3 of the present disclosure. As shown in FIG. 6, the receiver 600 includes an estimation apparatus 601 for clipping distortion of multicarrier signals or a compensation apparatus 602 for clipping distortion of multicarrier signals. Structures and functions of the estimation apparatus 601 for clipping distortion of multicarrier signals or the compensation apparatus 602 for clipping distortion of multicarrier signals being identical to those described in embodiments 1 and 2, the contents of which being incorporated herein, and being not going to be described herein any further.

Figure 7:
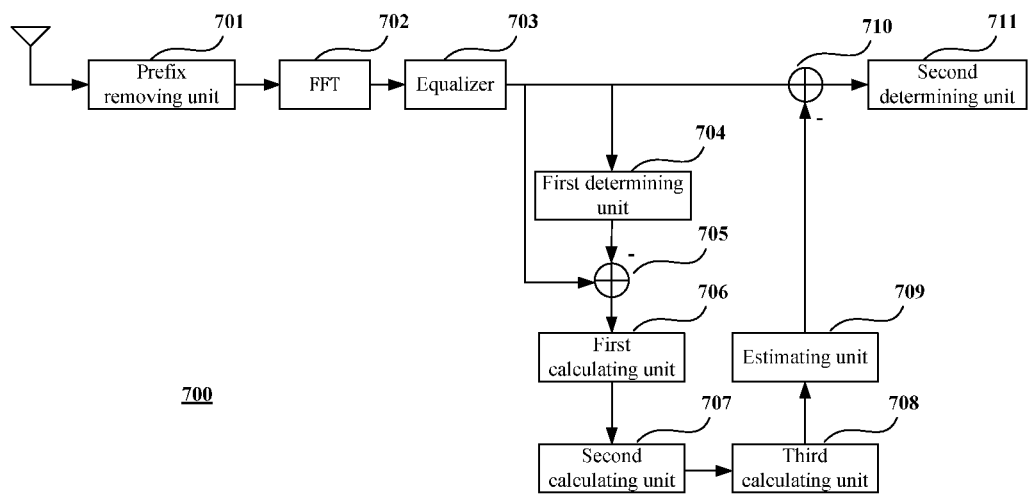
FIG. 7 is a schematic diagram of a hardware structure of the receiver 700 of Embodiment 3 of the present disclosure.

FIG. 7 is a schematic diagram of a hardware structure of the receiver 700 of Embodiment 3 of the present disclosure. As shown in FIG. 7, the receiver 700 includes a prefix removing unit 701, a fast Fourier transform (FFT) unit 702, an equalizer 703, a first determining unit 704, a first adder 705, a first calculating unit 706, a second calculating unit 707, a third calculating unit 708, an estimating unit 709, a second adder 710 and a second determining unit 711.

The prefix removing unit 701 removes a cyclic prefix of a received subcarrier signal, the fast Fourier transform unit 702 performs fast Fourier transform on the signal with a cyclic prefix being removed, the equalizer 703 performs equalization on the signal after being performed fast Fourier transform, the equalization-processed signal is determined by the first determining unit 704. For example, a signal after being processed by the equalizer is "0.8", and is determined as "−1" or "1" by the first determining unit 704; when a result of determination is "1", the result of determination is subtracted by the equalization-processed signal by using the first adder 705, so as to obtain an error signal of each subcarrier; the first calculating unit 706 multiplies the error signal of each subcarrier by a conjugation of an error signal of a subcarrier neighboring or spaced apart from the subcarrier, the second calculating unit 707 calculates an average value of all results of multiplication, the third calculating unit 708 is configured to calculate parameters of the clipping distortion of the multicarrier signal according to the average value, the estimating unit 709 estimates the clipping distortion of the multicarrier signal according to the parameters of the clipping distortion, the second adder subtracts the equalization-processed signal by the estimated clipping distortion, so as to obtain a clipping distortion-compensated signal, and the second determining unit 711 determines an ideal constellation point to which the compensated signal is close.

In this embodiment, the prefix removing unit 701, the fast Fourier transform unit 702, the equalizer 703, the first determining unit 704, the first adder 705, the second adder 710 and the second determining unit 711 may use an existing structures and functions, and structures and functions of the first calculating unit 706, the second calculating unit 707, the third calculating unit 708 and the estimating unit 709 are identical to those described in Embodiment 1, the contents of which being incorporated herein, and being not going to be described herein any further.

It can be seen from the above embodiment that by calculating the parameters of the clipping distortion of the multicarrier signals according to the error signals of the subcarriers, the clipping distortion of the multicarrier signals may be accurately estimated and compensated, with the method of calculation being simple and the bit error rate being low.

Embodiment 4

Figure 8:
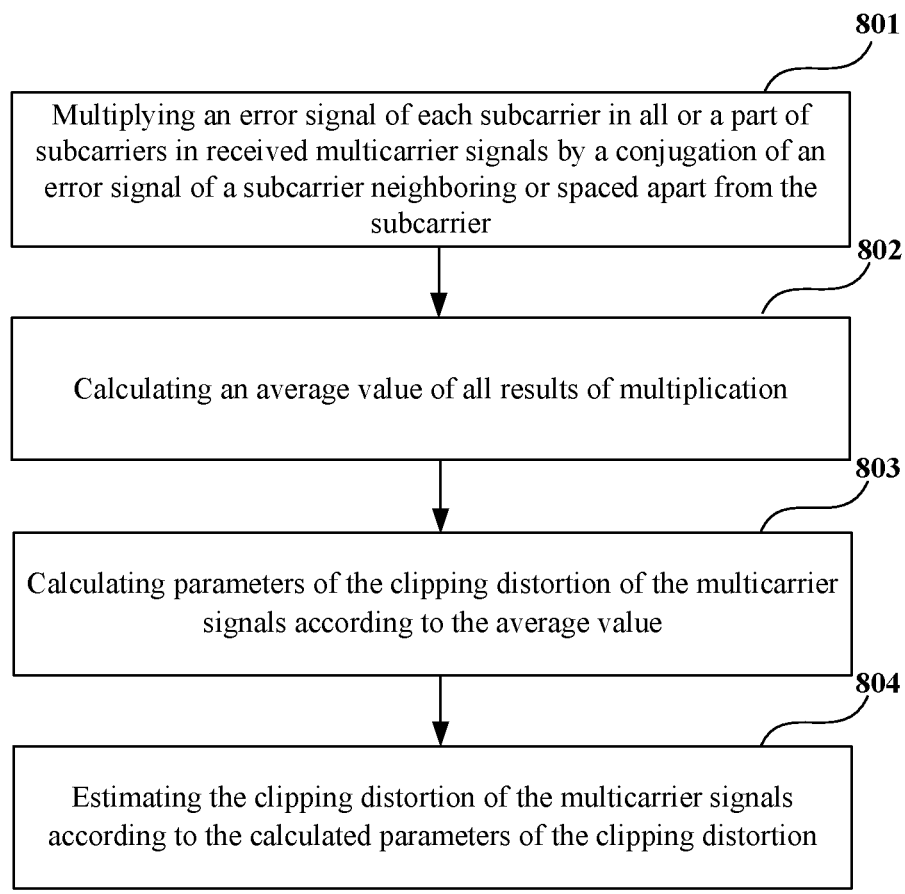
FIG. 8 is a flowchart of the estimation method for clipping distortion of multicarrier signals of Embodiment 4 of the present disclosure.

FIG. 8 is a flowchart of the estimation method for clipping distortion of multicarrier signals of Embodiment 4 of the present disclosure, which corresponds to the estimation apparatus for clipping distortion of multicarrier signals of Embodiment 1. As shown in FIG. 8, the method includes:

Step 801: multiplying an error signal of each subcarrier in all or part of subcarriers in received multicarrier signals by a conjugation of an error signal of a subcarrier neighboring or spaced apart from the subcarrier;

Step 802: calculating an average value of all results of multiplication;

Step 803: calculating parameters of the clipping distortion of the multicarrier signals according to the average value; and Step 804: estimating the clipping distortion of the multicarrier signals according to the calculated parameters of the clipping distortion.

In this embodiment, the method for calculating the parameters of the clipping distortion and the method for estimating the clipping distortion are identical to those described in Embodiment 1, and shall not be described herein any further.

It can be seen from the above embodiment that by calculating the parameters of the clipping distortion of the multicarrier signals according to the error signals of the subcarriers, the clipping distortion of the multicarrier signals may be accurately estimated, with the method of calculation being simple and the bit error rate being low.

Embodiment 5

Figure 9:
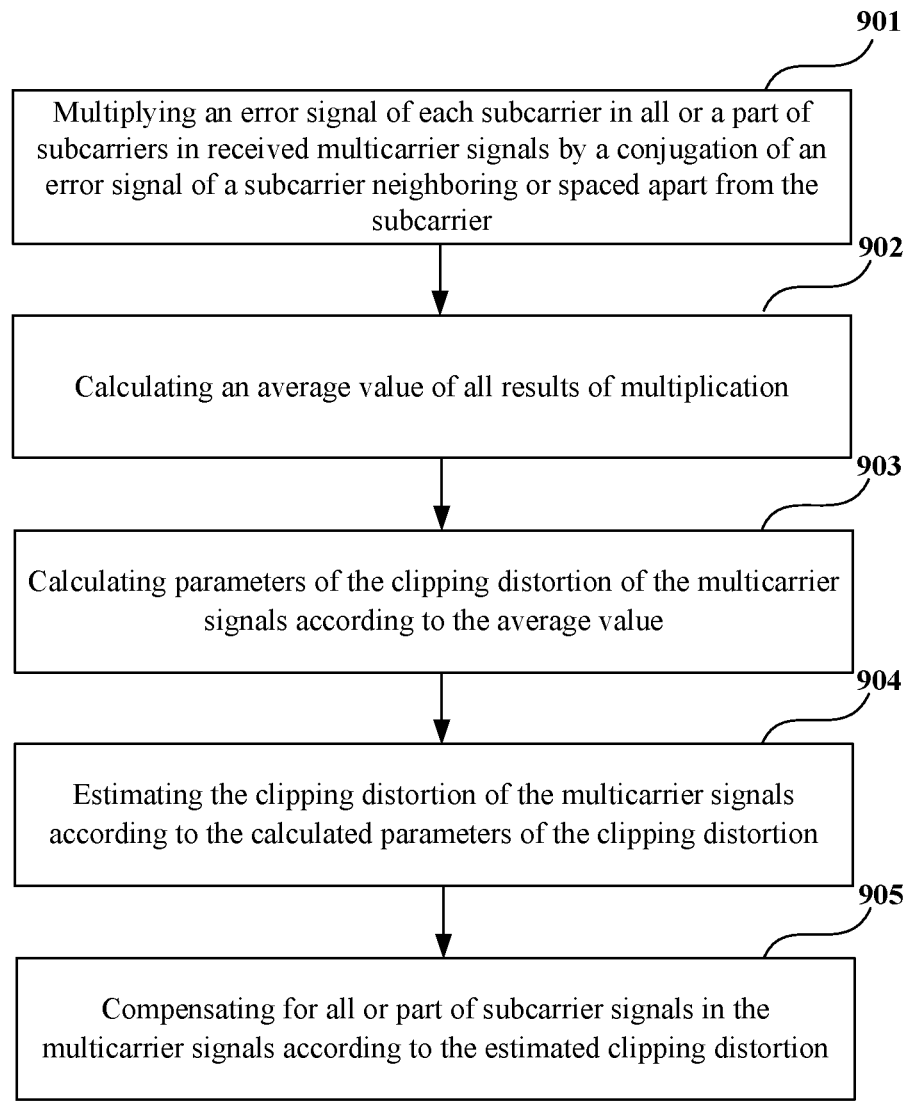
FIG. 9 is a flowchart of the compensation method for clipping distortion of multicarrier signals of Embodiment 5 of the present disclosure.

FIG. 9 is a flowchart of the compensation method for clipping distortion of multicarrier signals of Embodiment 5 of the present disclosure, which corresponds to the compensation apparatus for clipping distortion of multicarrier signals of Embodiment 2. As shown in FIG. 9, the method includes:

Step 901: multiplying an error signal of each subcarrier in all or part of subcarriers in received multicarrier signals by a conjugation of an error signal of a subcarrier neighboring or spaced apart from the subcarrier;

Step 902: calculating an average value of all results of multiplication;

Step 903: calculating parameters of the clipping distortion of the multicarrier signals according to the average value;

Step 904: estimating the clipping distortion of the multicarrier signals according to the calculated parameters of the clipping distortion; and Step 905: compensating for all or part of subcarrier signals in the multicarrier signals according to the estimated clipping distortion.

In this embodiment, the method for calculating parameters of the clipping distortion, the method for estimating the clipping distortion according to the parameters and the method for compensating for all or part of subcarrier signals in the multicarrier signals according to the estimated clipping distortion are identical to those described in Embodiment 1, and shall not be described herein any further.

It can be seen from the above embodiment that by calculating the parameters of the clipping distortion of the multicarrier signals according to the error signals of the subcarriers, the clipping distortion of the multicarrier signals may be accurately estimated and compensated, with the method of calculation being simple and the bit error rate being low.

An embodiment of the present disclosure further provides a computer-readable program, wherein when the program is executed in an estimation apparatus and compensation apparatus for clipping distortion of multicarrier signals or a receiver, the program enables the estimation apparatus and compensation apparatus for clipping distortion of multicarrier signals or the receiver to carry out the estimation method for clipping distortion of multicarrier signals as described in Embodiment 4 or the compensation method for clipping distortion of multicarrier signals as described in Embodiment 5.

An embodiment of the present disclosure further provides a storage medium in which a computer-readable program is stored, wherein the computer-readable program enables the estimation apparatus and compensation apparatus for clipping distortion of multicarrier signals or the receiver to carry out the estimation method for clipping distortion of multicarrier signals as described in Embodiment 4 or the compensation method for clipping distortion of multicarrier signals as described in Embodiment 5.

The above apparatuses and methods of the present disclosure may be implemented by hardware, or by hardware in combination with software. The present disclosure relates to such a computer-readable program that when the program is executed by a logic device, the logic device is enabled to carry out the apparatus or components as described above, or to carry out the methods or steps as described above. The present disclosure also relates to a storage medium for storing the above program, such as a hard disk, a floppy disk, a CD, a DVD, and a flash memory, etc.

The present disclosure is described above with reference to particular embodiments. However, it should be understood by those skilled in the art that such a description is illustrative only, and not intended to limit the protection scope of the present disclosure. Various variants and modifications may be made by those skilled in the art according to the principles of the present disclosure, and such variants and modifications fall within the scope of the present disclosure.

For the implementation of the present disclosure containing the above embodiments, following supplements are further disclosed.

Supplement 1. An estimation apparatus for clipping distortion of multicarrier signals, comprising:

a first calculating unit configured to multiply an error signal of each subcarrier in all or part of subcarriers in received multicarrier signals by a conjugation of an error signal of a subcarrier neighboring or spaced apart from the subcarrier;

a second calculating unit configured to calculate an average value of all results of multiplication;

a third calculating unit configured to calculate parameters of the clipping distortion of the multicarrier signals according to the average value; and an estimating unit configured to estimate the clipping distortion of the multicarrier signals according to the calculated parameters of the clipping distortion.

Supplement 2. The apparatus according to supplement 1, wherein the part of subcarriers are subcarriers of a noise less than a predefined first threshold value or a signal to noise ratio greater than a predefined second threshold value.

Supplement 3. The apparatus according to supplement 1, wherein the parameters of the clipping distortion of the multicarrier signals comprise: an amplitude of the clipping distortion and a location of a pulse of the clipping distortion in a time-domain waveform; and wherein the location of the pulse of the clipping distortion in the time-domain waveform is slope of a phase of the clipping distortion varying according to serial numbers of the subcarriers.

Supplement 4. The apparatus according to supplement 1, wherein the third calculating unit comprises:

a fourth calculating unit configured to calculate the location of the pulse of the clipping distortion in the time-domain waveform by taking an angle of the average value of all results of multiplication; and a fifth calculating unit configured to calculate the amplitude of the clipping distortion by finding a square root of an absolute value of the average value of all results of multiplication.

Supplement 5. The apparatus according to supplement 4, wherein the third calculating unit further comprises:

a sixth calculating unit configured to calculate a phase of each subcarrier of the clipping distortion in all or part of subcarriers in multiple carriers according to the location of the pulse of the clipping distortion in the time-domain waveform, and calculate the amplitude of the clipping distortion according to the phase and the error signal of each subcarrier in all or part of the subcarriers in the multiple carriers; and a determining unit configured to compare the amplitude of the clipping distortion calculated by the sixth calculating unit and the amplitude of the clipping distortion calculated by the fifth calculating unit, and determine a symbol of the amplitude of the clipping distortion calculated by the fifth calculating unit.

Supplement 6. The apparatus according to supplement 1, wherein the third calculating unit comprises:

a seventh calculating unit configured to take an angle of the average value of all results of multiplication, and calculate the location of the pulse of the clipping distortion in the time-domain waveform; and an eighth calculating unit configured to calculate a phase of each subcarrier of the clipping distortion in all or part of the subcarriers in the multiple carriers according to the location of the pulse of the clipping distortion in the time-domain waveform, and calculate an amplitude of the clipping distortion according to the phase and the error signal of each subcarrier in all or part of the subcarriers in the multiple carriers.

Supplement 7. A compensation apparatus for clipping distortion of multicarrier signals, comprising:

a first calculating unit configured to multiply an error signal of each subcarrier in all or part of subcarriers in received multicarrier signals by a conjugation of an error signal of a subcarrier neighboring or spaced apart from the subcarrier;

a second calculating unit configured to calculate an average value of all results of multiplication;

a third calculating unit configured to calculate parameters of the clipping distortion of the multicarrier signals according to the average value;

an estimating unit configured to estimate the clipping distortion of the multicarrier signals according to the calculated parameters of the clipping distortion; and a compensating unit configured to compensate for all or part of subcarrier signals in the multicarrier signals according to the estimated clipping distortion.

Supplement 8. The apparatus according to supplement 7, wherein the part of subcarrier signals are subcarrier signals of a modulation constellation greater than a predefined threshold value.

Supplement 9. A receiver, comprising the apparatus as described in any one of supplements 1-8.

Supplement 10. A communication system, comprising the receiver as described in supplement 9.

Supplement 11. An estimation method for clipping distortion of multicarrier signals, comprising:

multiplying an error signal of each subcarrier in all or part of subcarriers in received multicarrier signals by a conjugation of an error signal of a subcarrier neighboring or spaced apart from the subcarrier;

calculating an average value of all results of multiplication;

calculating parameters of the clipping distortion of the multicarrier signals according to the average value; and estimating the clipping distortion of the multicarrier signals according to the calculated parameters of the clipping distortion.

Supplement 12. The method according to supplement 11, wherein the part of subcarriers are subcarriers of a noise less than a predefined first threshold value or a signal to noise ratio greater than a predefined second threshold value.

Supplement 13. The method according to supplement 11, wherein the parameters of the clipping distortion of the multicarrier signals comprise: an amplitude of the clipping distortion and a location of a pulse of the clipping distortion in a time-domain waveform; and wherein the location of the pulse of the clipping distortion in the time-domain waveform is slope of a phase of the clipping distortion varying according to serial numbers of the subcarriers.

Supplement 14. The method according to supplement 11, wherein the calculating parameters of the clipping distortion of the multicarrier signals according to the average value comprises:

calculating the location of the pulse of the clipping distortion in the time-domain waveform by taking an angle of the average value of all results of multiplication; and calculating the amplitude of the clipping distortion by finding a square root of an absolute value of the average value of all results of multiplication.

Supplement 15. The method according to supplement 14, wherein the calculating parameters of the clipping distortion of the multicarrier signals according to the average value further comprises:

calculating a phase of each subcarrier of the clipping distortion in all or part of subcarriers in multiple carriers according to the location of the pulse of the clipping distortion in the time-domain waveform, and calculating the amplitude of the clipping distortion according to the phase and the error signal of each subcarrier in all or part of the subcarriers in the multiple carriers; and comparing the amplitude of the clipping distortion and the amplitude of the clipping distortion calculated by finding a square root of an absolute value of the average value of all results of multiplication, and determining a symbol of the amplitude of the clipping distortion calculated by finding a square root of an absolute value of the average value of all results of multiplication.

Supplement 16. The method according to supplement 11, wherein the calculating parameters of the clipping distortion of the multicarrier signals according to the average value comprises:

taking an angle of the average value of all results of multiplication, and calculating the location of the pulse of the clipping distortion in the time-domain waveform; and calculating a phase of each subcarrier of the clipping distortion in all or part of the subcarriers in the multiple carriers according to the location of the pulse of the clipping distortion in the time-domain waveform, and calculate an amplitude of the clipping distortion according to the phase and the error signal of each subcarrier in all or part of the subcarriers in the multiple carriers.

Supplement 17. A compensation method for clipping distortion of multicarrier signals, comprising:

multiplying an error signal of each subcarrier in all or part of subcarriers in received multicarrier signals by a conjugation of an error signal of a subcarrier neighboring or spaced apart from the subcarrier;

calculating an average value of all results of multiplication;

calculating parameters of the clipping distortion of the multicarrier signals according to the average value;

estimating the clipping distortion of the multicarrier signals according to the calculated parameters of the clipping distortion; and compensating for all or part of subcarrier signals in the multicarrier signals according to the estimated clipping distortion.

Supplement 18. The method according to supplement 17, wherein the part of subcarrier signals are subcarrier signals of a modulation constellation greater than a predefined threshold value.

The invention claimed is:

1. An estimation apparatus for clipping distortion of multicarrier signals, comprising:
a memory that stores a plurality of instructions; and
a processor coupled to the memory and configured to execute the instructions to,
multiply an error signal of each subcarrier in all or part of subcarriers in received multicarrier signals by a conjugation of an error signal of a subcarrier neighboring or spaced apart from the subcarrier;
calculate an average value of all results of multiplication;
calculate parameters of the clipping distortion of the multicarrier signals according to the average value; and
estimate the clipping distortion of the multicarrier signals according to the calculated parameters of the clipping distortion.

2. The apparatus according to claim 1, wherein the part of subcarriers are subcarriers of a noise less than a predefined first threshold value or a signal to noise ratio greater than a predefined second threshold value.

3. The apparatus according to claim 1, wherein the parameters of the clipping distortion of the multicarrier signals comprise: an amplitude of the clipping distortion and a location of a pulse of the clipping distortion in a time-domain waveform; and wherein the location of the pulse of the clipping distortion in the time-domain waveform is slope of a phase of the clipping distortion varying according to serial numbers of the subcarriers.

4. The apparatus according to claim 1, wherein the processor is configured to execute the instructions to:
calculate the location of the pulse of the clipping distortion in the time-domain waveform by taking an angle of the average value of all results of multiplication; and
calculate the amplitude of the clipping distortion by finding a square root of an absolute value of the average value of all results of multiplication.

5. The apparatus according to claim 4, wherein the processor is further configured to execute the instructions to:
calculate a phase of each subcarrier of the clipping distortion in all or part of subcarriers in multiple carriers according to the location of the pulse of the clipping distortion in the time-domain waveform, and calculate the amplitude of the clipping distortion according to the phase and the error signal of each subcarrier in all or part of the subcarriers in the multiple carriers; and compare the amplitude of the clipping distortion calculated according to the phase and the error signal of each subcarrier in all or part of the subcarriers in the multiple carriers and the amplitude of the clipping distortion calculated by finding the square root of the absolute value of the average value of all results of multiplication, and determine a symbol of the amplitude of the clipping distortion calculated by finding the square root of the absolute value of the average value of all results of multiplication.

6. The apparatus according to claim 1, wherein the processor is configured to execute the instructions to:

take an angle of the average value of all results of multiplication, and calculate the location of the pulse of the clipping distortion in the time-domain waveform; and calculate a phase of each subcarrier of the clipping distortion in all or part of the subcarriers in the multiple carriers according to the location of the pulse of the clipping distortion in the time-domain waveform, and calculate an amplitude of the clipping distortion according to the phase and the error signal of each subcarrier in all or part of the subcarriers in the multiple carriers.

7. A compensation apparatus for clipping distortion of multicarrier signals, comprising:

a memory that stores a plurality of instructions; and a processor coupled to the memory and configured to execute the instructions to:

multiply an error signal of each subcarrier in all or part of subcarriers in received multicarrier signals by a conjugation of an error signal of a subcarrier neighboring or spaced apart from the subcarrier;

calculate an average value of all results of multiplication;

calculate parameters of the clipping distortion of the multicarrier signals according to the average value;

estimate the clipping distortion of the multicarrier signals according to the calculated parameters of the clipping distortion; and compensate for all or part of subcarrier signals in the multicarrier signals according to the estimated clipping distortion.

8. The apparatus according to claim 7, wherein the part of subcarrier signals are subcarrier signals of a modulation constellation greater than a predefined threshold value.

9. A receiver, comprising an estimation apparatus for clipping distortion of multicarrier signals, the estimation apparatus for clipping distortion of multicarrier signals comprising:

a memory that stores a plurality of instructions; and a processor coupled to the memory and configured to execute the instructions to:

multiply an error signal of each subcarrier in all or part of subcarriers in received multicarrier signals by a conjugation of an error signal of a subcarrier neighboring or spaced apart from the subcarrier;

calculate an average value of all results of multiplication;

calculate parameters of the clipping distortion of the multicarrier signals according to the average value, and estimate the clipping distortion of the multicarrier signals according to the calculated parameters of the clipping distortion.

* * * * *